United States Patent

Ringeisen et al.

[11] Patent Number: 5,309,118
[45] Date of Patent: May 3, 1994

[54] HYPERFREQUENCY GENERATOR WITH SOURCE ELEMENT LOCATED IN THE RESONANT CAVITY

[75] Inventors: Victor Ringeisen, Riedseltz; Laurent Martinache, Haguenau, both of France

[73] Assignee: Sadis Bruker Spectrospin Societe Anonyme de Diffusion de l'Instrumentation Scientifique Bruker Spectrospin (Societe Anonyme a Directoire), Wissembourg, France

[21] Appl. No.: 890,133

[22] Filed: May 29, 1992

[30] Foreign Application Priority Data

May 29, 1991 [FR] France .................. 91 06630

[51] Int. Cl.$^5$ ............................. H03B 7/14
[52] U.S. Cl. .................. 331/96; 331/107 DP; 331/177 R; 331/177 V
[58] Field of Search .......... 331/96, 107 R, 107 DP, 331/177 R, 177 V; 333/227

[56] References Cited

U.S. PATENT DOCUMENTS 3,534,293 10/1970 Harkless .
4,727,338 2/1988 Mamodaly et al. ............... 331/96

FOREIGN PATENT DOCUMENTS 0284485 9/1988 European Pat. Off. .
56-91506 7/1981 Japan .

*Primary Examiner*—David Mis
*Attorney, Agent, or Firm*—Young & Thompson

[57] ABSTRACT

A hyperfrequency generator comprising a source element (5) of negative resistance adjacent to a cylindrical resonant cavity (2) closed at opposite ends by two transversal closure plates (4, 7) for the purpose of tuning over a frequency band. The source element (5) is installed directly in the resonant cavity (2) such that there is a direct coupling between the source element (5) and the resonant cavity (2). One of the closure plates (7) is movable toward and away from the other for rough tuning.

17 Claims, 6 Drawing Sheets

FIG. 6
FIG. 7
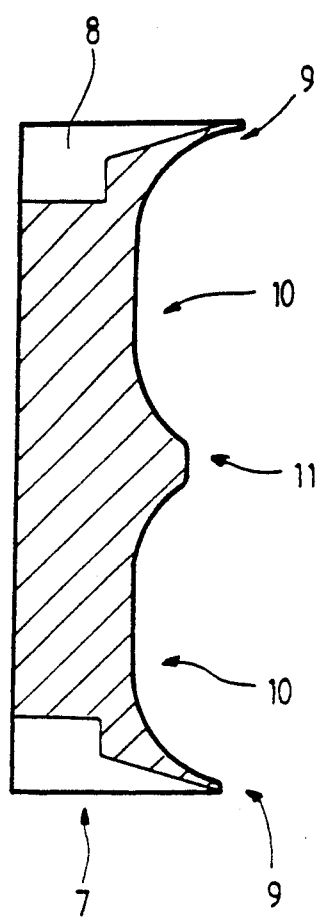
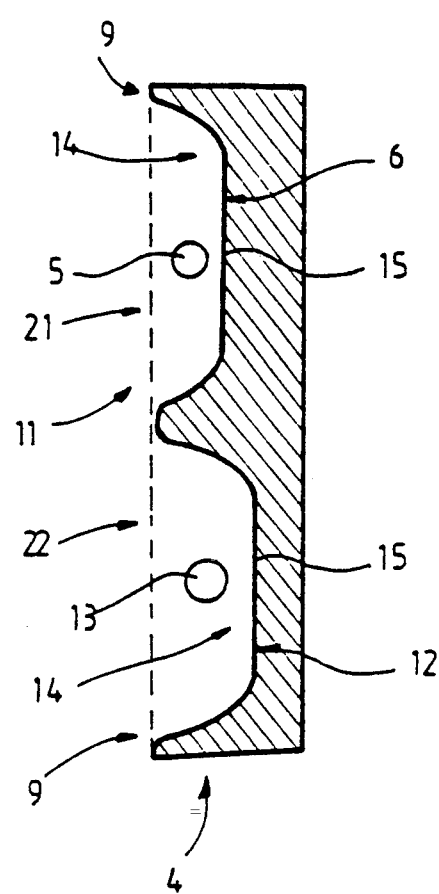
FIG. 8
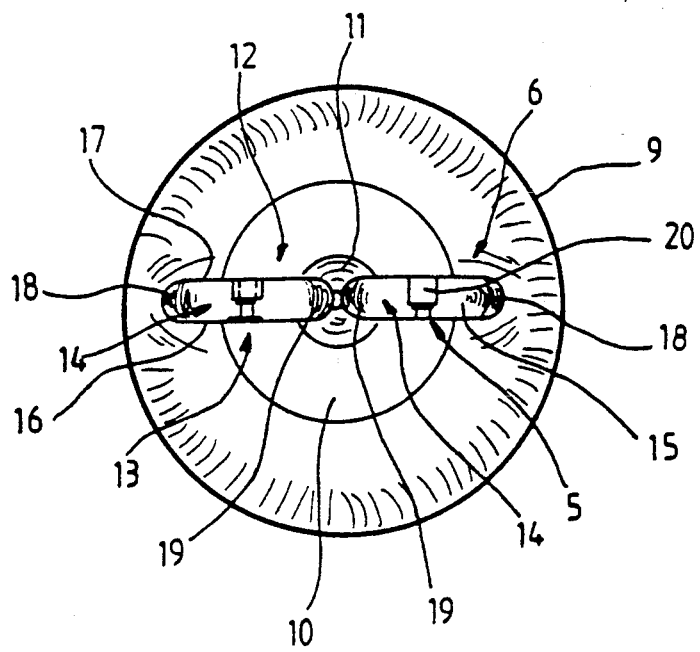

HYPERFREQUENCY GENERATOR WITH SOURCE ELEMENT LOCATED IN THE RESONANT CAVITY

FIELD OF THE INVENTION

The present invention concerns a hyperfrequency generator using a hyperfrequency source directly installed in the resonant cavity.

BACKGROUND OF THE INVENTION

Many hyperfrequency generators are known using a semi-conductor component as source element.

These are diodes known, for example, under the denominations IMPATT, LSA, tunnel diodes, GUNN effect diodes, and other components of negative resistance.

The emitting diode is installed inside a closed volume connected to the adjoining resonant cavity through a specific adjustable coupler.

According to American patent No. 3,534,293, HARKLESS inventor, the hyperfrequency source element is mounted in its feeding circuit in series with a rectilineal radiating rod coaxially disposed in a cylindrical volume. This radiating rod constitutes the coupling antenna present in a chamber adjacent to a resonant cylindrical cavity.

Because of its role and position, this chamber constitutes a preresonator.

This preresonator includes a transversal output leading to an intermediate adjustable conduit and is connected transversely to a cylindrical resonant cavity of variable volume whose output is connected to the load.

This preresonator presents the characteristics adapted for the envisioned range of frequencies. It assures filtering out undesirable modes.

The coupler is tuned by a screw to the desired frequency to select the modes that will be excited in the resonant cavity.

This type of generator with preresonator has the drawback of a high selectivity as to frequency.

So, these generators cannot furnish, above a certain level, a constant level of power over a large range of frequencies.

However, some applications demand the maintenance of a sufficient level of power over a large range of frequencies while at the same time, presenting a very low degree of phase noise.

SUMMARY OF THE INVENTION

The goal of the present invention is to remedy these inconveniences by proposing a hyperfrequency generator of great stability and of significant power substantially constant over the range of frequencies from 9 to 10 GHz.

The hyperfrequency generator according to this invention is remarkable in that the hyperfrequency source is situated directly inside the resonant cavity of the resonator.

Preferably, the source element is in an integral part of the resonant cavity and can notably be located in a notch planned in the thickness of one of the walls of said resonant cavity, the latter being directly coupled to the output of the generator.

The generator, according to this invention, presents many performance characteristics and many advantages:

direct coupling of the hyperfrequency source element to the resonator;
high output power level for this type of generator (500 mW) that permits it to replace, in certain cases, a reflex klystron;
very low phase noise that corresponds to an excellent frequency definition;
large tunable spectrum;
good stability; little frequency drift.

The generator joins the principal advantages always sought after: power, low phase noise, and large tunable spectrum.

BRIEF DESCRIPTION OF THE DRAWINGS

The technical characteristics and other advantages of this invention are set forth in the following description, effectuated as an example only, and not limiting on the modes of execution in reference to the annexed drawings in which:

FIG. 6 is a schematic view in transverse cross section on a medial plane of the movable closure plate;

FIG. 7 is a schematic cross section on a plane passing through the line of the notches in the fixed closure plate;

FIG. 8 is a detail plan view of the contour of the front face of the fixed closure plate;

DETAILED DESCRIPTION OF THE INVENTION

Figure 1:
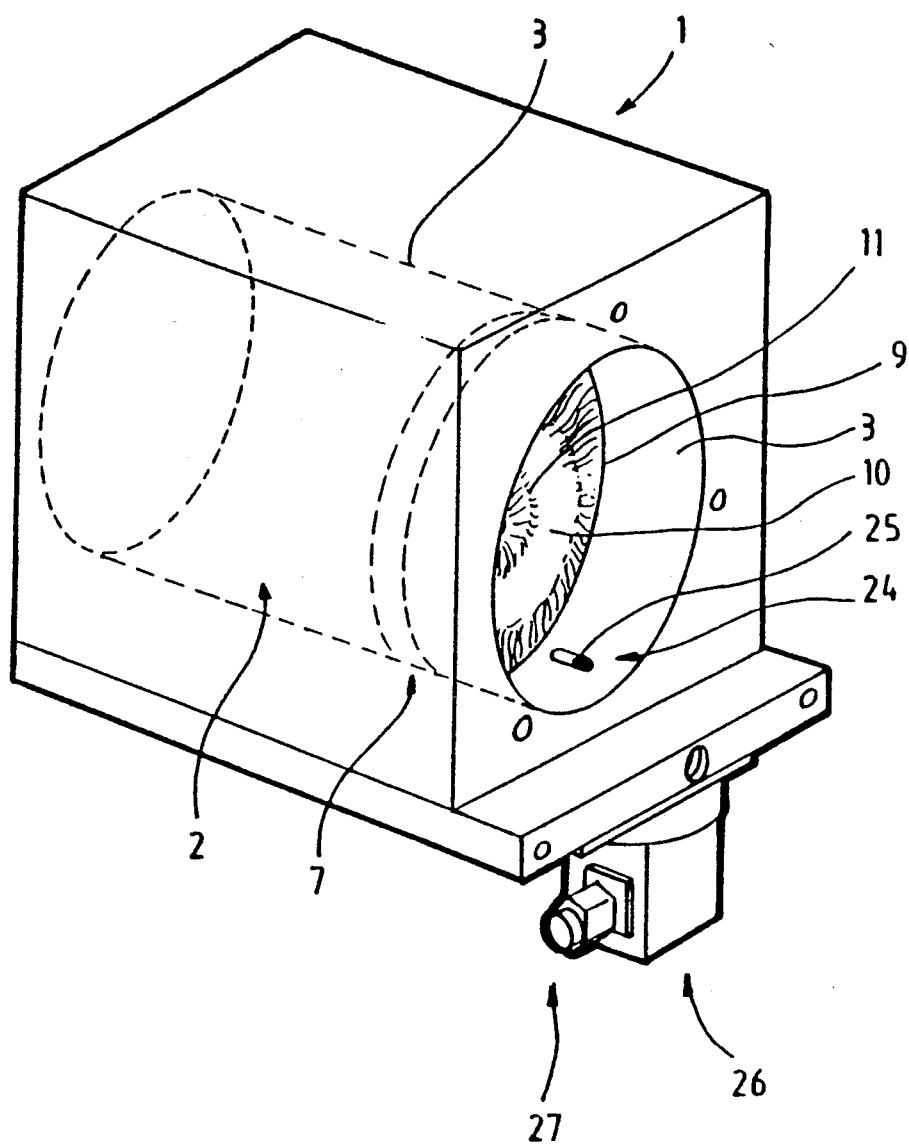
FIG. 1 is a perspective view of the body of the hyperfrequency oscillator, with its resonant cavity open, as seen from the side.
Figure 2:
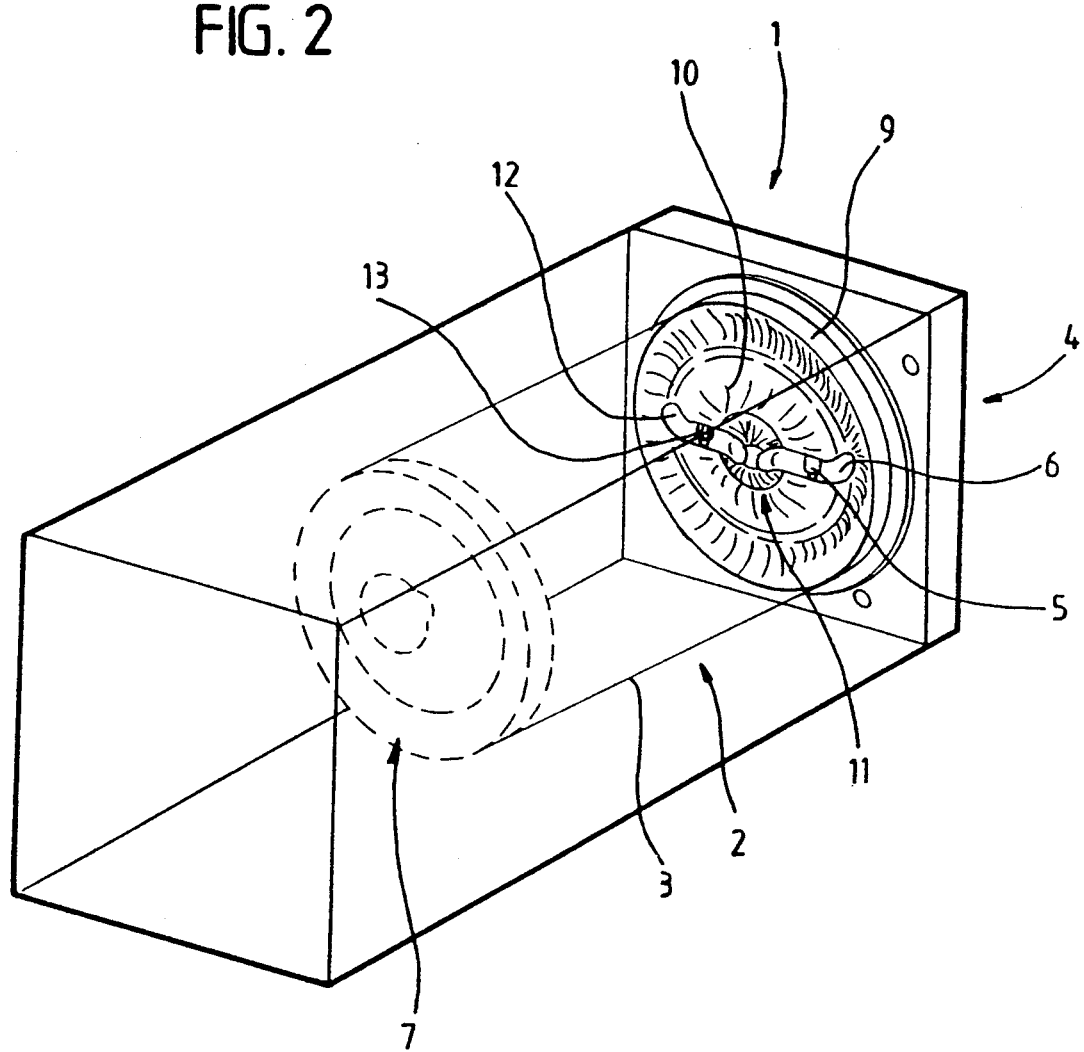
FIG. 2 is a perspective view of the closed resonant cavity, as seen from behind, the mechanical block being transparently represented.
Figure 3:
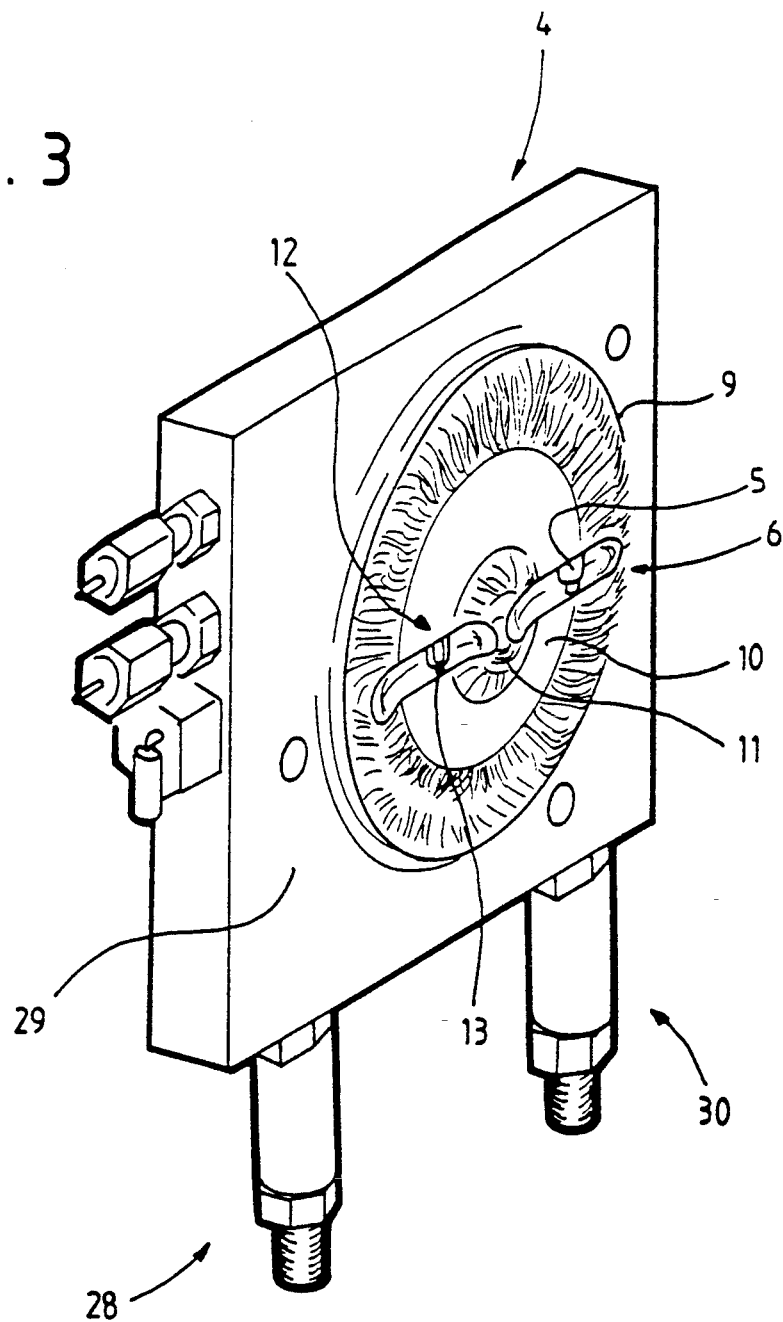
FIG. 3 is a perspective view of the fixed closure plate.
Figure 4:
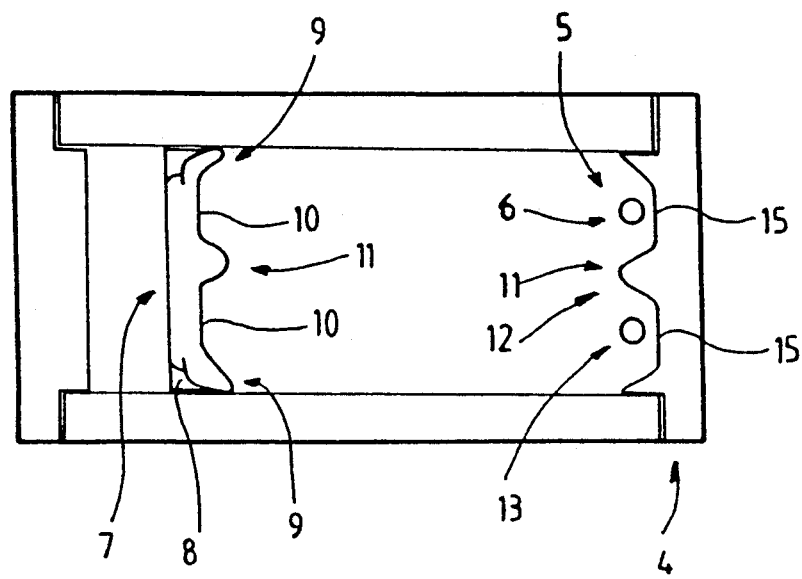
FIG. 4 is a schematic view of the longitudinal cross section in line with the notches of the resonant cavity.
Figure 5:
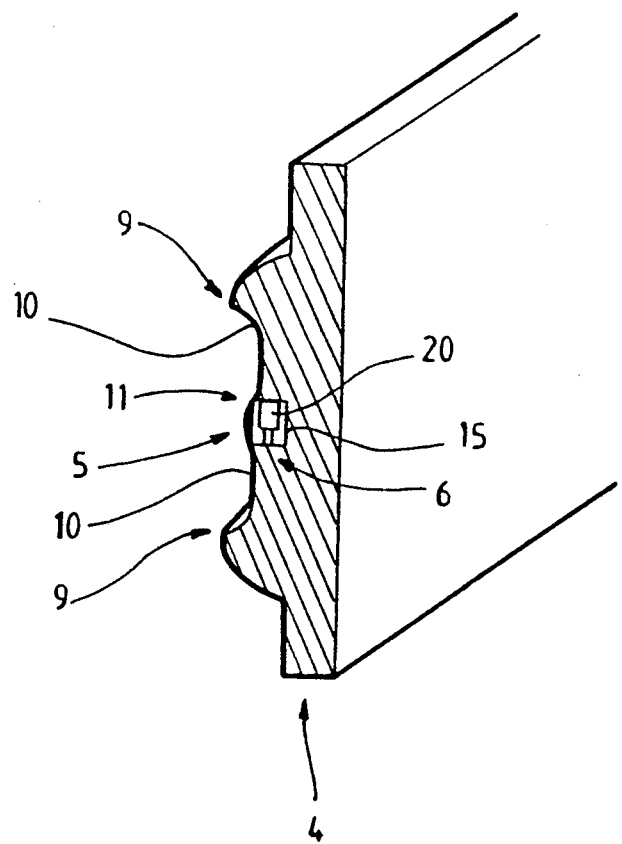
FIG. 5 is a longitudinal cross section of the fixed closure plate on a section at the level of the source element.

According to the invention, and as the FIGS. 1 to 10 show, the hyperfrequency generator of the type comprising a source element 5 of negative resistance adjacent to a cylindrical resonant cavity 2, comprising two transversal closure plates 4, 7 for tuning purposes over a frequency band, is principally characterized in that the source element 5 is installed directly in the resonant cavity 2.

Preferably, the source element 5 is an integral part of the resonant cavity 2, permitting the direct coupling between said source element 5 and said resonant cavity 2.

It can, notably, be arranged or lodged in a notch 6 provided within the thickness of one of the walls of the resonant cavity 2, the latter being directly coupled to the output of the hyperfrequency generator.

More precisely, the hyperfrequency generator according to the invention is in the form of a mechanical block 1 delimiting an enclosure of variable volume used as the resonant cavity 2 of general cylindrical form presenting an enveloping lateral surface 3 closed at one of its extremities by a reflecting and fixed transversal closure plate containing, according to the first variant, a hyperfrequency source element 5 placed in a so-called source notch 6, provided in the thickness of the wall. The enclosure delimited by the body 1 is closed at its other extremity by a reflecting and mobile transversal closure plate 7.

The second closure plate 7 is movable along the length of the interior side wall of the cylindrical enclosure in the manner of a piston.

The closure plate 7 is of metal and is surrounded by an adjustment ring 8, of absorbent ferrite, with the cross section of the resonant cavity.

This mobile closure plate 7 permits the tuning of the resonant frequency on a specific frequency within a frequency spectrum ranging from 9 to 10 GHz.

Each closure plate has a general plate-like shape comprising an annular incurved border 9, a flat bottom 10 and a central protuberance 11 of general conic form.

In addition to the source notch 6, the fixed closure plate 4 includes a so-called tuning notch 12. These notches 6 and 12 are radial, directed following a same diameter and are located on either side of the central protuberance.

The notch 6 is called the source because it contains the hyperfrequency source element 5 and notch 12 is called tuning because it contains a variable capacitive element 13 permitting a rapid and fine tuning of frequency after a gross tuning by the use of the closing wall 7.

The following describes the general conformation of the notches represented more particularly in the cross sectional views of the closure plates and in FIG. 8.

Each notch has, for example, over practically all the length of a radius, the general conformation of a throat 14 with a flat bottom 15 and sides 16 and 17 parallel and perpendicular to the bottom, forming a section of generally rectangular shape. The throat terminates longitudinally in two identical extremities 18 and 19, in the form of a slightly incurved inclined ramp.

As indicated above, the two notches 6 and 12 are disposed in a generally radial direction. They are located in the prolongation of one another on a same diameter.

According to the represented variant, the notches 6 and 12 each occupy a length of almost all of a radius.

In the source notch 6 is lodged, in a transverse position, and retracted, the hyperfrequency source element 5, for example, a GUNN effect diode, or any other appropriate component of negative resistance.

The hyperfrequency source element 5 has a body in direct physical and electrical contact by one of its terminals with the body of the cavity that acts as physical and electrical mass and, by the other of its terminals, to the continuous polarization generator through a contact piece 20.

The body of the hyperfrequency source element 5, as well as that of the variable capacitive element 13, are disposed transversely of the longitudinal parallel walls of the notch and are sunk below the entry planes 21 and 22, respectively of the source and tuning notches 6 and 12 as represented in the figures.

In the other tuning notch 12 is lodged the variable capacitive element 13, such as, for example, a capacitor known under the denomination VARICAP, whose value is modifiable by its polarization voltage.

This capacitor constitutes the electronic component of a tuning circuit of automatic frequency control known under the mark AFC. It permits rapid modification of the tuning characteristics of the hyperfrequency oscillator, but only in a narrow frequency band. This variable capacitor is used to adjust the frequency and to obtain rapid frequency modulation.

Tuning within a larger frequency band is effectuated by the displacement of the mobile closure plate along the length of the lateral surface 3 of the resonant cavity 2, in the manner of a piston.

The source notch 6 and tuning notch 12 have different depths. The source notch 6 is, for example, not as deep as the tuning notch 12 as the figures show.

Other emplacements are possible for the notch in which the hyperfrequency source 5 is placed, as indicated below.

Figure 9:
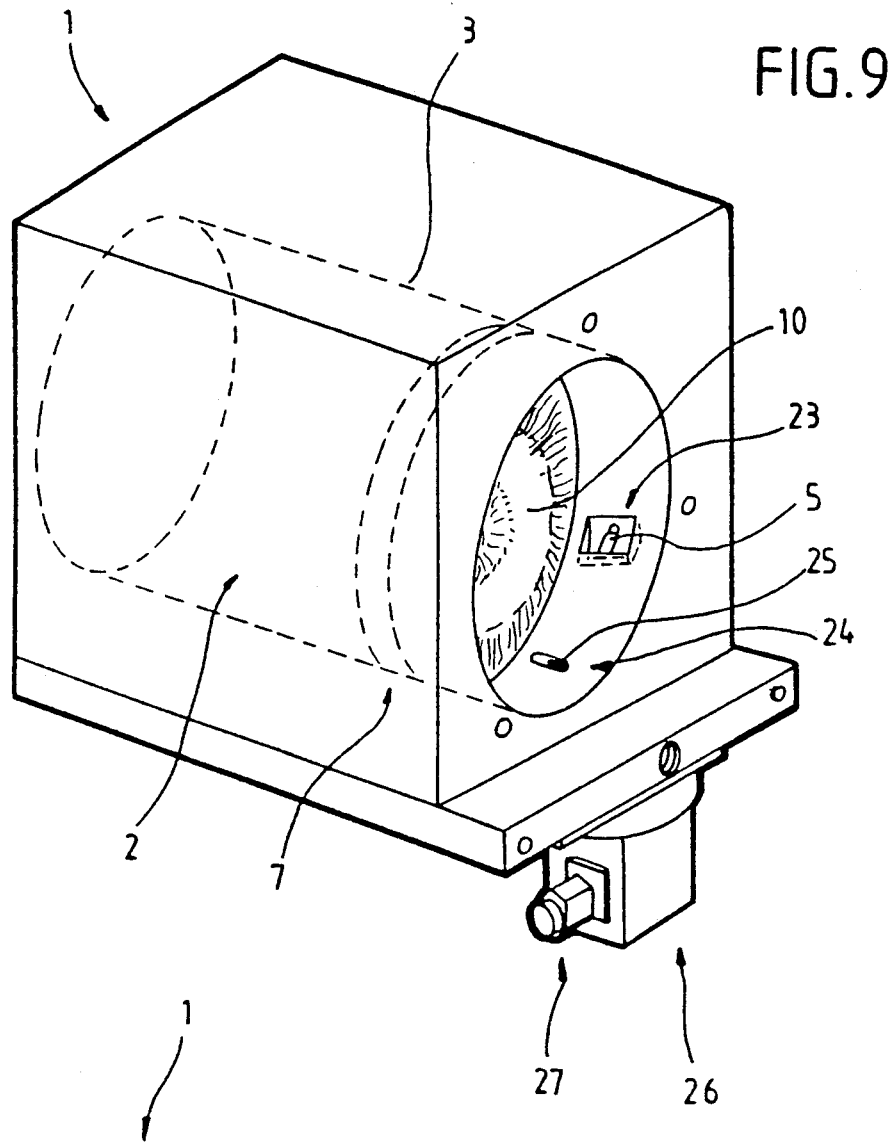
FIG. 9 is a simplified perspective view of the whole of the generator, illustrative of a variant presenting a source element placed in a notch provided in the lateral wall of the resonant cavity.
Figure 10:
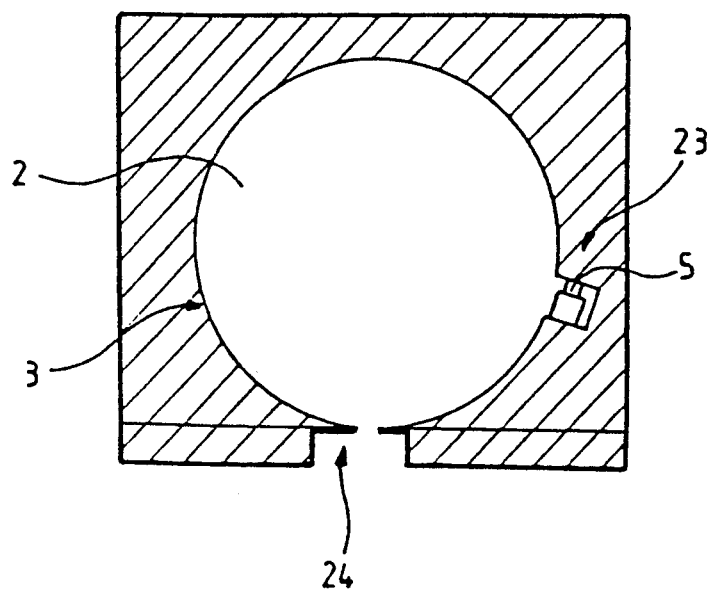
FIG. 10 is a transversal cross sectional view on a plane perpendicular to the axis of the cylinder and at the level of the source element.

One obtains in this manner the same performance of the oscillator by placing the source element 5 in a longitudinal notch 23 cut from the internal wall of the lateral surface of the cylindrical body of the cavity, as schematically represented in FIGS. 9 and 10.

According to that variant, the longitudinal notch 23 has a shape generally identical or analogous to that which exists in the wall of the fixed closure plate 4 of the first variant described above. This notch is oriented along a general parallel direction to the main geometrical axis of the cylinder constituting the interior volume of the resonant cavity 2.

The longitudinal notch 23 contains the hyperfrequency source element 5, and either, as before, in an adjacent notch the variable capacitor known under the VARICAP denomination, or in a different notch planned for another emplacement.

The following is the description of the output of the generator. The coupling of the output is effectuated by an iris hole 24 tunable by a screw 25. It emerges in a joining piece 26 connected to a hyperfrequency propagation conduit or to a hyperfrequency coaxial cable 27 towards the load or utilization circuit.

One obtains the same results by using an output magnetic coupling antenna.

The displacements of the mobile closure plate 7 are controlled by a micromotor with mechanical reducer meshing with a linear displacement mechanism of the piston tied to the value of the rated frequency.

Because of the level of the emitted power, and to keep the source in optimal functioning conditions, a cooling circuit is provided in the inside of the fixed closure plate 4. It consists of a cooling system with water circulation having an inlet conduit 28, an interior cooling chamber 29 and an outlet conduit 30.

The regulating of the generator to a given frequency is done in the following manner.

One adjusts the resonant cavity 2 in the best manner possible to tune the cavity to the desired frequency with the aid of the displacement of the mobile closure plate 7.

One then precisely adjusts the frequency with the aid of the automatic frequency control circuit using the variable capacitor of type VARICAP.

The contemplated fields of application of this invention are as follows:

PER (Parametric Electronic Resonance) spectroscopy;

scientific electronic measurement applications.

One must also mention that the technical characteristics described above permit one to contemplate the construction of generators of substantially higher or lower frequencies situated for example in the 30–40 GHz range, with frequency regulation possible in a band of several hundreds of MHz on either side of the nominal frequency.

Thanks to this invention, it is now possible to realize a hyperfrequency generator having a direct coupling between the source element 5 and modulation element 13 and the resonant cavity 2, by the intermediary of the notches 6 and 12, whose dimensions and geometric configurations influence the characteristics and rate of this coupling.

The coupling described above benefits from the advantages of a solid conception allied with an intimate physical contact between the source element 5 and the resonant cavity 2, which is indispensable in the case of a power source, without degrading the quality coefficient of the resonator or the resonant chamber 2.

The specific structure in accordance with the invention, permits one to simultaneously obtain, on one hand a high output power, and on the other hand, a low output phase noise, and finally, an excellent frequency stability both on short and long term, this latter advantage being inherent in the mechanical inertia of the structure.

It is to be understood that the invention is not limited to the embodiments described and represented in the attached drawings. Modifications remain possible, notably in the constitution of the various elements, or by substituting technical equivalents without however departing from the scope of the protection of the invention.

I claim:

1. In a hyperfrequency generator of the type comprising a source element (5) of negative resistance adjacent to a cylindrical resonant cavity (2) closed at opposite ends by two transverse closure plates (4, 7) movable toward and away from each other for the purpose of tuning over a frequency band; the improvement wherein the source element (5) is installed in a notch in a wall of the resonant cavity (2) below an open upper end of the notch and extending between side walls of the notch such that there is a direct physical and electrical coupling between said source element (5) and said side walls of said notch, said source element receiving its bias through a said side wall of said notch.

2. Generator according to claim 1, characterized in that the hyperfrequency source (5) is lodged in one of the transverse closure plates of the resonant cavity (2).

3. Generator according to claim 2, characterized in that the hyperfrequency source (5) is lodged in a source notch (6) in a fixed closure plate (4) of the resonant cavity (2).

4. Generator according to claim 1, characterized in that the hyperfrequency source (5) is lodged in a longitudinal notch (23) provided in the lateral surface (3) of the resonant cavity (2).

5. Generator according to claim 4, characterized in that the notch (23) is oriented along the direction of the main geometric axis of the cylindrical volume of the resonant cavity (2).

6. Generator according to claim 3, characterized in that the source notch (6) is oriented along a radius.

7. Generator according to claim 6, characterized in that the source notch (6) extends over substantially all of a radius.

8. Generator according to claim 3, characterized in that a modulation and tuning notch (12), adjacent to the notch (6) containing the hyperfrequency source element, contains a capacitive element (13).

9. Generator according to claim 8, characterized in that the capacitive element (13) is a variable capacitor.

10. Generator according to claim 9, characterized in that the variable capacitor (13) is of a type known under the denomination of VARICAP.

11. Generator according to claim 1, characterized in that the fixed (4) and mobile (7) closure plates have a general plate-like conformation delimited by an incurved annular border (9), and a central protuberance (11) of conical shape.

12. Generator according to claim 3, characterized in that the source notch (6) is less deep than a tuning notch (12).

13. Generator according to claim 1, characterized in that the fixed closure plate (4) is comprised of two radial notches (6) and (12) on each side of a central protuberance (11).

14. Generator according to claim 13, characterized in that the notches (6) and (12) are located in the prolongation of one another on the same diameter.

15. Generator according to claim 3, characterized in that the hyperfrequency source element (5) is located in a medina transversal position in the notch (6).

16. Generator according to claim 8, characterized in that the capacitive element (13) is located in a median transversal position in its notch (12).

17. Generator according to claim 1, characterized in that the source element 5 is directly exposed to the interior of the resonant cavity 2.

* * * * *